United States Patent
Hayashi et al.

(10) Patent No.: US 9,131,621 B2
(45) Date of Patent: Sep. 8, 2015

(54) WIRING SUBSTRATE AND METHOD FOR PRODUCING WIRING SUBSTRATE

(71) Applicant: NGK SPARK PLUG CO., LTD., Nagoya-shi, Aichi (JP)

(72) Inventors: Takahiro Hayashi, Chino (JP); Makoto Wakazono, Niwa-gun (JP); Takeshi Toyoshima, Komaki (JP); Makoto Nagai, Komaki (JP); Makoto Origuchi, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 3 days.

(21) Appl. No.: 14/258,984

(22) Filed: Apr. 22, 2014

(65) Prior Publication Data
US 2014/0318846 A1   Oct. 30, 2014

(30) Foreign Application Priority Data
Apr. 24, 2013   (JP) .................................. 2013-091490

(51) Int. Cl.
| | |
|---|---|
| *H05K 1/14* | (2006.01) |
| *H05K 3/00* | (2006.01) |
| *H01L 23/00* | (2006.01) |
| *H05K 3/34* | (2006.01) |

(52) U.S. Cl.
CPC ................ *H05K 1/144* (2013.01); *H01L 24/05* (2013.01); *H05K 3/0014* (2013.01); *H05K 3/3452* (2013.01); *H05K 3/3489* (2013.01); *H05K 2201/099* (2013.01); *H05K 2203/0577* (2013.01); *H05K 2203/0594* (2013.01)

(58) Field of Classification Search
CPC .... H05K 1/144; H05K 3/0014; H05K 3/0011
See application file for complete search history.

(56) References Cited

FOREIGN PATENT DOCUMENTS

JP       2012-074595 A       4/2012

*Primary Examiner* — Jeremy C Norris
(74) *Attorney, Agent, or Firm* — Stites & Harbison PLLC; Jeffrey A. Haeberlin; James R. Hayne (57) ABSTRACT

A wiring substrate includes a layered structure including one or more insulating layers and one or more conductor layers; a plurality of connection terminals formed on the layered structure; a first resin layer formed on the layered structure and having (defining) a plurality of first openings through which the connection terminals are respectively exposed; and a second resin layer formed on the first resin layer and having (defining) a plurality of second openings through which the connection terminals are respectively exposed and which are smaller in opening diameter than the first openings, wherein the second resin layer has, around each of the second openings, an inclined surface which is formed such that the distance between the inclined surface and the layered structure decreases toward the second opening.

8 Claims, 5 Drawing Sheets

WIRING SUBSTRATE AND METHOD FOR PRODUCING WIRING SUBSTRATE

CROSS REFERENCE TO RELATED APPLICATIONS

The present application claims priority to Japanese Patent Application No. 2013-091490, which was filed on Apr. 24, 2013, the disclosure of which is hereby incorporated by reference in its entirety.

BACKGROUND OF THE INVENTION

1. Field of the Invention

The present invention relates to a wiring substrate, and to a method for producing the wiring substrate.

2. Description of Related Art

In one type of wiring substrate, connection terminals (pads) have thereon a solder ball. In the wiring substrate, an opening through which at least a portion of the connection terminal is exposed is formed in the outermost layer of solder resist, a flux and a solder ball are charged into the opening of the solder resist layer, and the connection terminal is electrically connected to the solder ball through reflow soldering.

In recent years, with the rapid progress of miniaturization of semiconductor packages, the number of connection terminals for a semiconductor chip sealed in a semiconductor package has increased. Therefore, the distance between connection terminals (pads) of a wiring substrate on which such semiconductor chips are mounted is reduced, and the bore diameter of an opening of a solder resist film through which the connection terminal is exposed is also reduced. Thus, there is a high likelihood that the opening fails to be provided with a solder ball; i.e., a high likelihood of the occurrence of a missing ball(s).

In connection therewith, there has been proposed a technique in which a guide portion having an opening whose bore diameter increases with the distance from a connection terminal increases is provided on a solder resist film for guiding a solder ball into the opening of the solder resist film (see, for example, Patent Document 1).

RELATED ART DOCUMENTS

Patent Document 1 is Japanese Patent Application Laid-Open (kokai) No. 2012-74595.

BRIEF SUMMARY OF THE INVENTION

However, in conventional wiring substrates, an opening is formed in a solder resist film through light exposure to a photosensitive solder resist and development of the light-exposed photosensitive solder resist. Therefore, the opening formed in the solder resist film has a sidewall which is generally perpendicular to the front surface of the solder resist film; i.e., difficulty is encountered in forming the opening in the solder resist film so as to have an inclined sidewall as described in Patent Document 1. Meanwhile, since the front surface of the solder resist film is flat, the sidewall of the opening formed in the solder resist film is generally orthogonal with respect to the front surface of the solder resist layer. Therefore, the opening may be insufficiently charged with a flux, and thus defective connection may occur between a solder ball and a connection terminal.

In view of the foregoing, an object of the present invention is to provide a wiring substrate in which an inclined surface is provided around an opening in which a solder ball is to be mounted, whereby a flux is readily supplied into the opening. Another object of the present invention is to provide a method for producing the wiring substrate.

In order to achieve the aforementioned objects, the present invention provides a wiring substrate comprising a layered structure including one or more insulating layers and one or more conductor layers; a plurality of connection terminals formed on the layered structure; a first resin layer formed on the layered structure and having a plurality of first openings through which the connection terminals are respectively exposed (i.e the first resin layer defines a plurality of first openings aligned with the plurality of connection terminals); and a second resin layer formed on the first resin layer and having a plurality of second openings through which the connection terminals are respectively exposed and which are smaller in opening diameter than the first openings (i.e. the second resin layer defines a plurality of second openings smaller in size than the plurality of first openings and aligned with the plurality of first openings), wherein the second resin layer has, around each of the plurality of second openings, an inclined surface which is formed such that the distance between the inclined surface and the layered structure decreases toward each of the plurality of second openings.

The wiring substrate of the present invention comprises the first resin layer having the first openings through which the connection terminals are respectively exposed (i.e. the first resin layer defines a plurality of first openings aligned with the plurality of connection terminals), and the second resin layer formed on the first resin layer and having the plurality of second openings through which the connection terminals are respectively exposed and which are smaller in opening diameter than the plurality of first openings (i.e. the second resin layer defines a plurality of second openings smaller in size than the plurality of first openings and aligned with the plurality of first openings), wherein the second resin layer has, around each of the plurality of second openings, an inclined surface which is formed such that the distance between the inclined surface and the layered structure decreases toward each of the plurality of second openings. Therefore, a flux can readily flow into each opening, and thus a sufficient amount of the flux can be supplied into each opening.

In one embodiment of the present invention, the plurality of connection terminals have a thickness smaller than that of the first resin layer (i.e. the thickness of the plurality of connection terminals is smaller than the thickness of the first resin layer).

According to one embodiment of the present invention, since the plurality of connection terminals have a thickness smaller than that of the first resin layer, the front surfaces of the connection terminals are located below the front surface of the first resin layer. Therefore, an inclined surface can be effectively formed on the second resin layer.

In another embodiment of the present invention, the second resin layer has a thickness smaller than that of the first resin layer (i.e. the thickness of the second resin layer is smaller than the thickness of the first resin layer).

According to another embodiment of the present invention, since the second resin layer has a thickness smaller than that of the first resin layer, the slope of the inclined surface can be increased; i.e., the inclined surface can be further tilted. Therefore, a flux readily flows over the inclined surface toward each second opening. Thus, a sufficient amount of the flux can be secured in the second opening.

In yet another embodiment of the present invention, the plurality of connection terminals have side surfaces which are respectively exposed through the first openings.

According to yet another embodiment of the present invention, since the side surfaces of the connection terminals are respectively exposed through the first openings, the slope of the inclined surface can be further increased. Therefore, a flux more readily flows over the inclined surface toward each second opening. Thus, a sufficient amount of the flux can be secured in the second opening.

The present invention also provides a method for producing a wiring substrate, the method comprising the steps of forming a layered structure by stacking one or more insulating layers and one or more conductor layers; forming a plurality of connection terminals on the layered structure; forming, on the layered structure, a first resin layer having a plurality of first openings through which the plurality of connection terminals are respectively exposed (i.e. the first resin layer defines a plurality of first openings aligned with the plurality of connection terminals); and forming, on the first resin layer, a second resin layer having a plurality of second openings through which the plurality of connection terminals are respectively exposed and which are smaller in opening diameter than the plurality of first openings (i.e. the second resin layer defines a plurality of second openings smaller in size than the plurality of first openings and aligned with the plurality of first openings, the steps being carried out in this order.

The method for producing a wiring substrate of the present invention comprises a step of forming a first resin layer on a layered structure formed by stacking one or more insulating layers and one or more conductor layers, the first resin layer having a plurality of first openings through which a plurality of connection terminals are respectively exposed (i.e. the first resin layer defines a plurality of first openings aligned with the plurality of connection terminals); and a step of forming, on the first resin layer, a second resin layer having a plurality of second openings through which the plurality of connection terminals are respectively exposed and which are smaller in opening diameter than the plurality of first openings (i.e. the second resin layer defines a plurality of second openings smaller in size than the plurality of first openings and aligned with the plurality of first openings, the steps being carried out in this order. Therefore, an inclined surface can be formed on the second resin layer around each of the plurality of second openings such that the distance between the inclined surface and the layered structure decreases toward each of the plurality of second opening. Thus, a flux can readily flow into each opening, and thus a sufficient amount of the flux can be supplied into each opening.

In another embodiment of the present invention, the plurality of connection terminals have a thickness smaller than that of the first resin layer (i.e. the thickness of the plurality of connection terminals is smaller than the thickness of the first resin layer).

According to another embodiment of the present invention, since the plurality of connection terminals have a thickness smaller than that of the first resin layer, the front surfaces of the plurality of connection terminals are located below the front surface of the first resin layer. Therefore, an inclined surface can be effectively formed on the second resin layer.

In yet another embodiment of the present invention, the second resin layer has a thickness smaller than that of the first resin layer (i.e. the thickness of the second resin layer is smaller than the thickness of the first resin layer.

According to yet another embodiment of the present invention, since the second resin layer has a thickness smaller than that of the first resin layer, the slope of the inclined surface can be increased; i.e., the inclined surface can be further tilted. Therefore, a flux readily flows over the inclined surface toward each second opening. Thus, a sufficient amount of the flux can be secured in each second opening.

In still another embodiment of the present invention, the first resin layer is formed on the layered structure so that side surfaces of the plurality of connection terminals are respectively exposed through the plurality of first openings.

According to still another embodiment of the present invention, since the side surfaces of the plurality of connection terminals are respectively exposed through the plurality of first openings, the slope of the inclined surface can be further increased. Therefore, a flux more readily flows over the inclined surface toward each second opening. Thus, a sufficient amount of the flux can be secured in each opening.

As described above, according to the present invention, there can be provided a wiring substrate in which an inclined surface is provided around an opening in which a solder ball is to be mounted, whereby a flux is readily supplied into the opening, as well as a method for producing the wiring substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment of the present invention will next be described in detail with reference to the drawings. The wiring substrate according to the below-described embodiment is only an example, and no particular limitation is imposed on the wiring substrate, so long as it includes at least one conductor layer and at least one resin insulating layer. Although the embodiment will be described by taking, as an example, a single-sided substrate in which a conductor layer and a resin insulating layer are stacked on one surface of a core substrate, the wiring substrate is not limited to such a single-sided substrate. That is, the wiring substrate may be a double-sided substrate in which a conductor layer and a resin insulating layer are stacked on opposite surfaces of a core substrate, or may be a wiring substrate having no core substrate.

Embodiment

Figure 1:
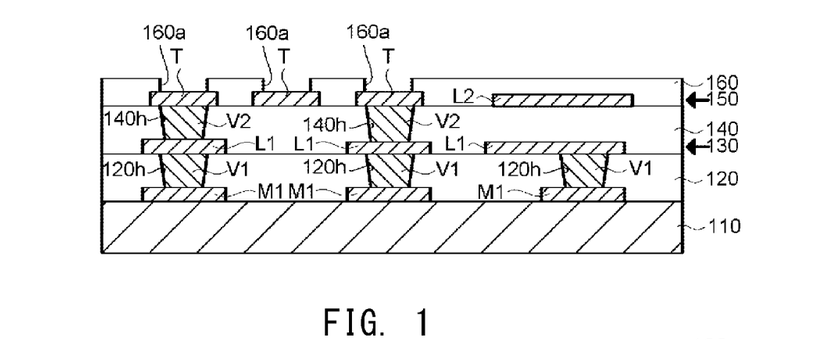
FIG. 1 is a cross-sectional view of a wiring substrate according to an embodiment.
Figure 2:
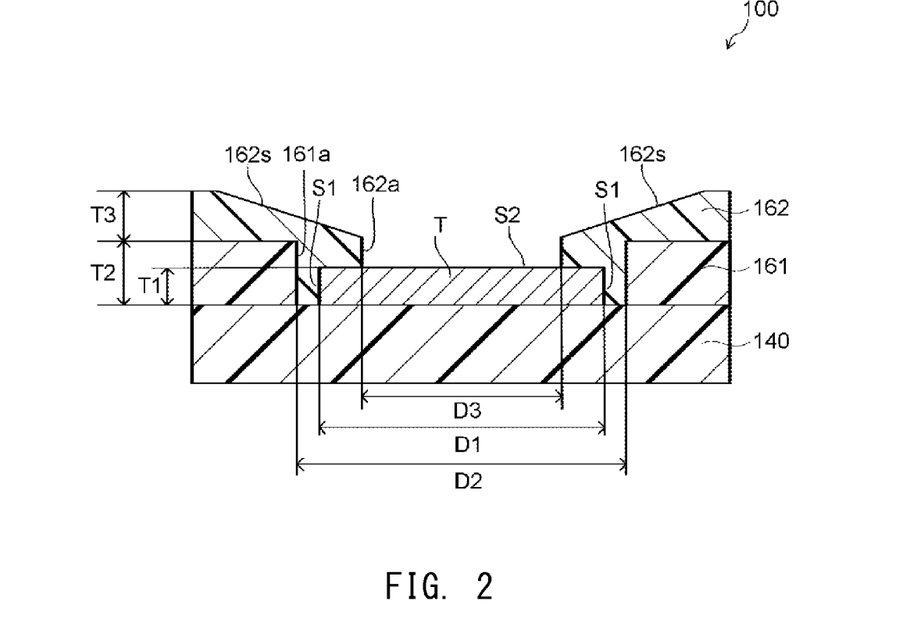
FIG. 2 is an enlarged cross-sectional view of the wiring substrate according to the embodiment.

FIG. 1 is a cross-sectional view of a wiring substrate 100 according to an embodiment. FIG. 2 is an enlarged cross-sectional view of a region including the vicinity of a connection terminal T of the wiring substrate 100. Next will be described the configuration of the wiring substrate 100 with reference to FIGS. 1 and 2.

Configuration of Wiring Substrate

The wiring substrate 100 includes a core substrate 110, a first insulating layer 120, a first conductor layer 130, first via conductors V1, a second insulating layer 140, a second conductor layer 150, second via conductors V2, and a resin layer 160. The first insulating layer 120, the first conductor layer 130, the first via conductors V1, and the second insulating layer 140 form a layered structure.

The core substrate 110 is a plate-like resin substrate formed of, for example, a heat-resistant resin (e.g., bismaleimide-triazine resin) or a fiber-reinforced resin (e.g., glass fiber-reinforced epoxy resin). Core wirings M1 are formed on the core substrate 110.

The first insulating layer 120, which is formed through thermal curing of a thermosetting resin composition, is provided on the core wirings M1. The first conductor layer 130, which includes wirings L1, is formed on the first insulating layer 120 through electroless copper plating and electrolytic copper plating. The core wirings M1 are electrically connected to the first conductor layer 130 by means of the via conductors V1 provided in via holes 120h formed in the first insulating layer 120.

The second insulating layer 140, which is formed through thermal curing of a thermosetting resin composition, is provided on the first conductor layer 130. The second conductor layer 150, which includes connection terminals T and wirings L2, is formed on the second insulating layer 140 through electroless copper plating and electrolytic copper plating. The first conductor layer 130 is electrically connected to the second conductor layer 150 by means of the via conductors V2 provided in via holes 140h formed in the second insulating layer 140. The connection terminals T serve as pads for connecting a semiconductor chip (not illustrated) which is to be mounted on the wiring substrate 100.

The resin layer 160, which has openings 160a through which at least a portion of the connection terminals T is exposed, is formed on the second conductor layer 150. Next will be described the configuration of the resin layer 160 with reference to FIG. 2.

As shown in FIG. 2, the resin layer 160 includes a first resin layer 161, and a second resin layer 162 formed on the first resin layer 161. The first resin layer 161 has a plurality of first openings 161a, and each connection terminal T is exposed through the corresponding first opening 161a (i.e. the first resin layer 161 defines a plurality of first openings 161a each aligned with a connection terminal T). The first opening 161a has an inner diameter D2 larger than the outer diameter D1 of the connection terminal T. Therefore, a side surface S1 of the connection terminal T is exposed through the first opening 161a.

The second resin layer 162 has a plurality of second openings 162a, and each connection terminal T is exposed through the corresponding second opening 162a (i.e. the second resin layer defines a plurality of second openings 162a each aligned with a first opening 161a). The second opening 162a has an inner diameter D3 smaller than the inner diameter D2 of the first opening 161a (i.e. the second opening 162a is smaller in size than the first opening 161a). The inner diameter D3 of the second opening 162a is smaller than the outer diameter D1 of the connection terminal T.

That is, the outer diameter D1 of the connection terminal T, the inner diameter D2 of the first opening 161a, and the inner diameter D3 of the second opening 162a satisfy the following relation (1):

$$\text{inner diameter } D2 \text{ of first opening } 161a > \text{outer diameter } D1 \text{ of connection terminal } T > \text{inner diameter } D3 \text{ of second opening } 162a \quad (1).$$

Therefore, the side surface S1 of the connection terminal T is covered with the second resin layer 162, and the front surface S2 of the connection terminal T is exposed through the second opening 162a.

The connection terminal T has a thickness T1 smaller than the thickness T2 of the first resin layer 161, and the second resin layer 162 has a thickness T3 smaller than the thickness T2 of the first resin layer 161. Specifically, the thickness T1 of the connection terminal T, the thickness T2 of the first resin layer 161, and the thickness T3 of the second resin layer 162 satisfy the following relations (2) and (3):

$$\text{thickness } T2 \text{ of first resin layer } 161 > \text{thickness } T1 \text{ of connection terminal } T \quad (2); \text{ and}$$

$$\text{thickness } T2 \text{ of first resin layer } 161 > \text{thickness } T3 \text{ of second resin layer } 162 \quad (3).$$

As used herein, the "thickness T3 of the second resin layer 162" corresponds to the thickness of a portion of the layer 162 outside the below-described inclined surface 162s.

The second resin layer 162 also has, around the second opening 162a, an inclined surface 162s which is formed such that the distance between the surface 162s and the layered structure decreases toward the second opening 162a.

Wiring Substrate Production Method

Figure 3A:
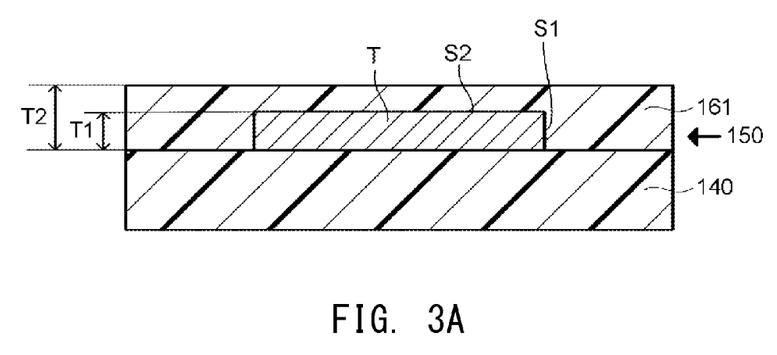
FIGS. 3A-3B are views of sketches showing processes for producing the wiring substrate according to the embodiment.
Figure 3B:
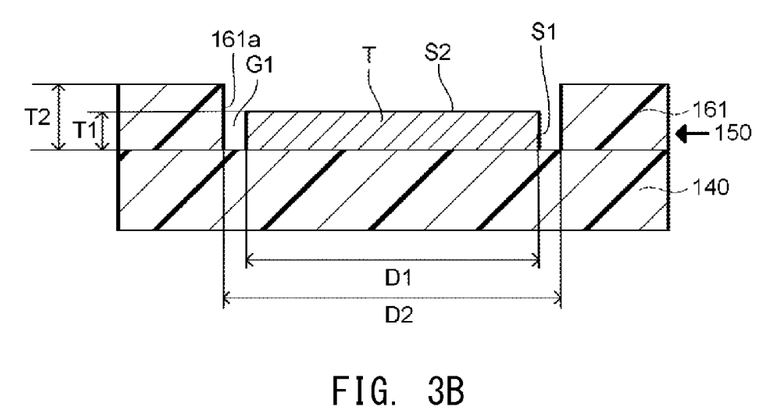
Figure 4A:
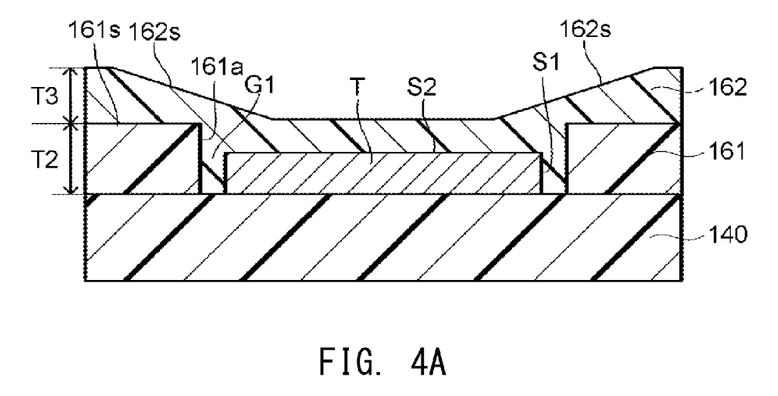
FIGS. 4A-4B are views of sketches showing processes for producing the wiring substrate according to the embodiment.
Figure 4B:
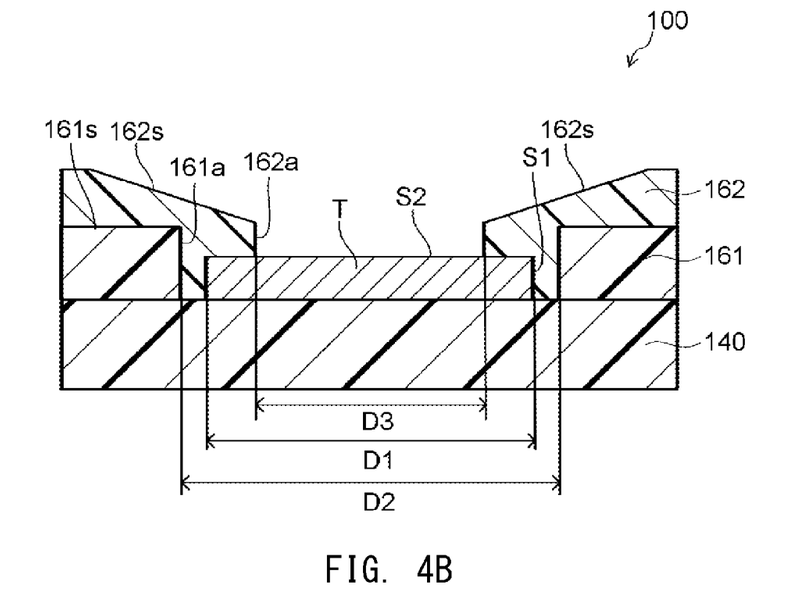

FIGS. 3 and 4 show steps of producing the wiring substrate 100 according to the embodiment. Next will be described the production method for the wiring substrate 100 with reference to FIGS. 3 and 4. The following description is focused only on the step of forming a resin layer 160 of the wiring substrate 100; i.e., description of steps of forming the other components of the wiring substrate 100 is omitted. Components common to those described above with reference to FIGS. 1 and 2 are denoted by the same reference numerals, and description thereof is omitted.

A solder resist film to form a first resin layer 161 is applied by pressing the solder resist film onto a conductor layer 150 including a connection terminal T and a wire L2 (see FIG. 3A). The thickness of the solder resist film is adjusted so that the thickness T2 of the first resin layer 161 is larger than the thickness T1 of the connection terminal T.

Subsequently, the solder resist film to become the first resin layer 161 is subjected to light exposure and development, to thereby form a first opening 161a (see FIG. 3B). The first opening 161a is formed so that the inner diameter D2 of the first opening 161a is larger than the outer diameter D1 of the connection terminal T. Since the inner diameter D2 of the first opening 161a is larger than the outer diameter D1 of the connection terminal T, a gap G1 is provided between the side surface S1 of the connection terminal T and the first resin layer 161; i.e., the side surface S1 of the connection terminal T is exposed.

Next, a solder resist film to become a second resin layer 162 is applied by pressing the solder resist film onto the front surface 161s of the first resin layer 161 (see FIG. 4A). The thickness of the solder resist film is adjusted so that the thickness T3 of the second resin layer 162 is smaller than the thickness T2 of the first resin layer 161.

In the wiring substrate 100, the thickness T1 of the connection terminal T is smaller than the thickness T2 of the first resin layer 161, and the gap G1 is provided between the side surface S1 of the connection terminal T and the first resin layer 161. Therefore, when the solder resist film to become the second resin layer 162 is applied by pressing the solder resist film onto the front surface 161s of the first resin layer 161, the level of a portion of the second resin layer 162 located on the front surface S2 of the connection terminal T becomes lower than that of another portion of the layer 162 by the difference between the thickness T1 of the connection terminal T and the thickness T2 of the first resin layer 161 (T2−T1). In addition, since the solder resist enters the gap G1, the level of a portion of the second resin layer 162 corresponding to the gap G1 becomes lower than that of another portion. Thus, an inclined surface 162s is formed on the second resin layer 162 around the second opening 162a such that the distance between the inclined surface 162s and the layered structure decreases toward the second opening 162a.

Then, the solder resist film to become the second resin layer 162 is subjected to light exposure and development, to thereby form the second opening 162a (see FIG. 4B). The second opening 162a is formed so that the inner diameter D3 of the second opening 162a is smaller than the outer diameter D1 of the connection terminal T. When the inner diameter D3 of the second opening 162a is smaller than the outer diameter D1 of the connection terminal T, only a portion of the front surface S2 of the connection terminal T is exposed through the second resin layer 162.

Figure 5:
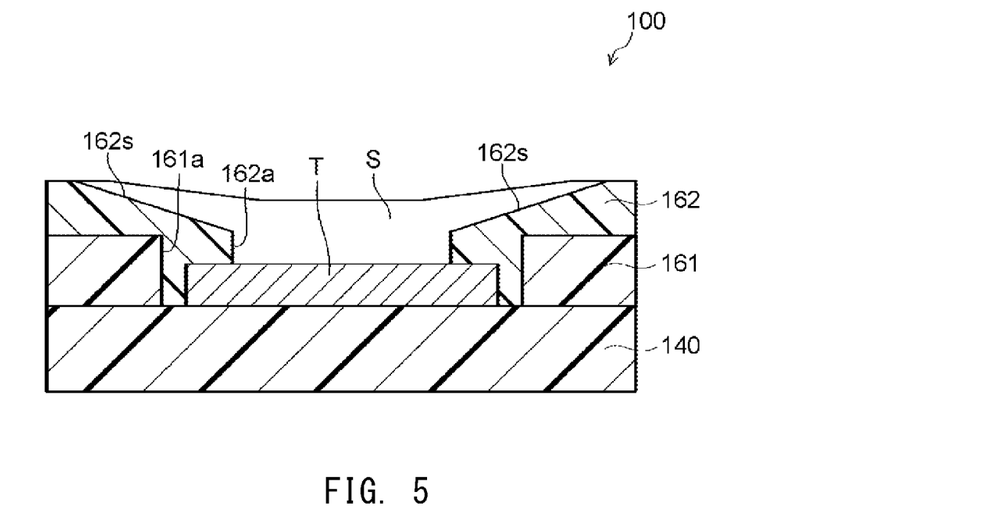
FIG. 5 is a cross-sectional view of the wiring substrate according to the embodiment to which a solder resist has been applied.

FIG. 5 is a cross-sectional view of the above-produced wiring substrate 100 according to the embodiment to which a solder resist has been applied. As shown in FIG. 5, in the wiring substrate 100, the second resin layer 162 has, around the second opening 162a, the inclined surface 162s which is formed such that the distance between the inclined surface 162s and the layered structure decreases toward the second opening 162a.

Therefore, when a flux S is applied to the wiring substrate 100, the flux S readily flows into the second opening 162a by means of the inclined surface 162s. That is, the flux S is readily supplied into the second opening 162a. Thus, a sufficient amount of the flux S can be secured in the second opening 162a.

Figure 6:
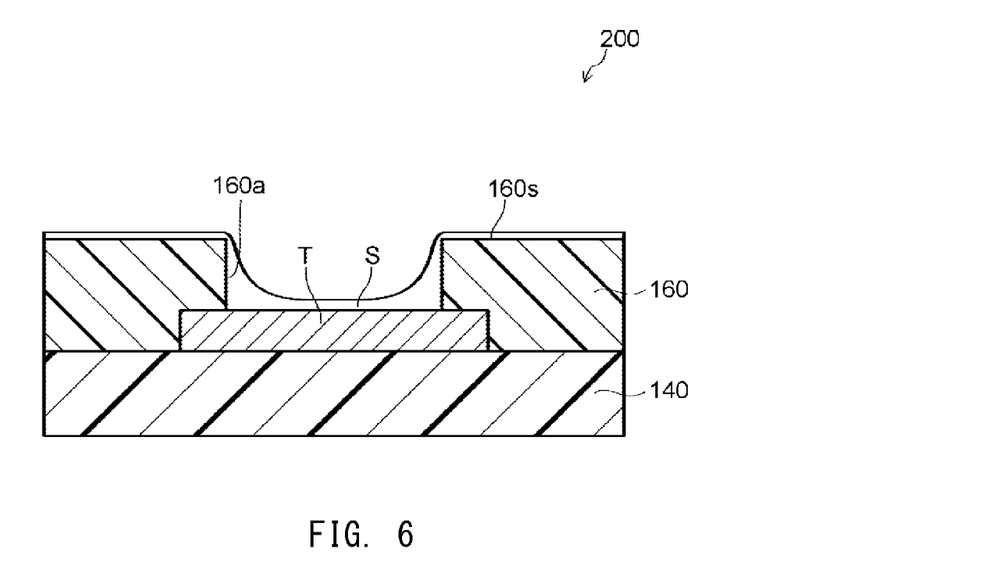
FIG. 6 is a cross-sectional view of a comparative wiring substrate.

FIG. 6 is a cross-sectional view of a comparative wiring substrate 200. Unlike the case of the wiring substrate 100 according to the embodiment, in the wiring substrate 200 shown in FIG. 6, a surface 160s of a resin layer 160 does not have, around an opening 160a, an inclined surface which is formed such that the distance between the inclined surface and the layered structure decreases toward the opening 160a. Therefore, a flux S does not readily flow into the opening 160a. Thus, a sufficient amount of the flux S may fail to be secured in the opening 160a.

As described above, in the wiring substrate 100 according to the embodiment, the second resin layer 162 has, around the second opening 162a, the inclined surface 162s which is formed such that the distance between the surface 162s and the layered structure decreases toward the second opening 162a. Therefore, when a flux is applied to the wiring substrate 100, the flux readily flows into the second opening 162a by means of the inclined surface 162s.

Thus, a sufficient amount of the flux can be secured in the second opening 162a, and defective connection between the connection terminal T and a solder ball (not illustrated), which would otherwise occur due to insufficient amount of the flux, can be prevented. Since the inclined surface 162s also serves as a guide portion for guiding a solder ball into the second opening 162a, there can be prevented a problem that the second opening 162a fails to be charged with a solder ball (i.e., occurrence of missing ball). In addition, since the apparent opening size becomes large by virtue of the presence of the inclined surface 162s, a solder ball having an outer size (diameter) larger than the inner diameter D3 of the opening 162a can be readily connected to the connection terminal T.

Alternatively, the first resin layer 161 and the second resin layer 162 may be formed from different types of solder resists, or may be formed from solder resists having different colors. For example, when the wiring substrate 100 having a specific color is produced, the second resin layer 162 may be formed from a solder resist having the specific color, whereas the first resin layer 161 may be formed from a solder resist having a color different from the specific color and exhibiting more excellent properties (e.g., adhesion and heat resistance). Thus, since optimum solder resists can be employed regardless of specified color or other properties, the resultant wiring substrate 100 exhibits improved properties.

Other Embodiments

Figure 7A:
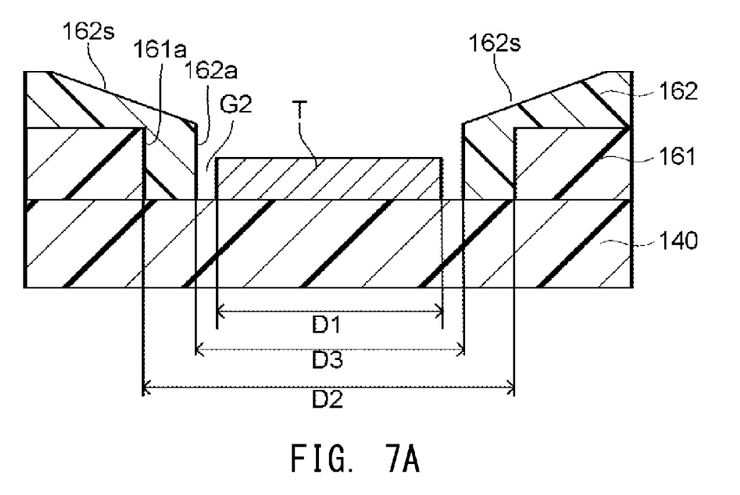
FIGS. 7A-7B are enlarged cross-sectional views of wiring substrates according to other embodiments.

In the wiring substrate 100 according to the above-described embodiment, as shown in FIG. 2, the side surface S1 of the connection terminal T is covered with the second resin layer 162. However, as shown in FIG. 7A, the inner diameter D3 of the second opening 162a of the second resin layer 162 may be larger than the outer diameter D1 of the connection terminal T. In this case, a gap G2 is provided between the side surface S1 of the connection terminal T and the second resin layer 162.

Figure 7B:
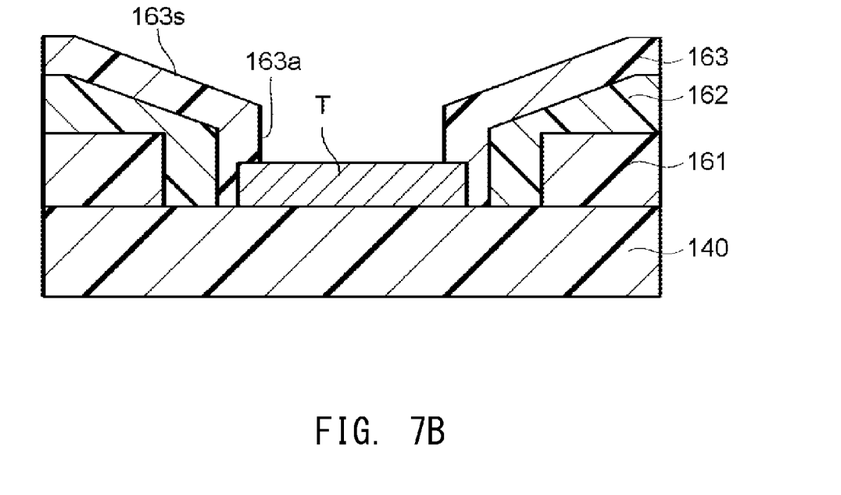

In the wiring substrate 100 according to the above-described embodiment, the resin layer 160 is formed of two layers; i.e., the first and second resin layers 161 and 162. However, as shown in FIG. 7B, the resin layer 160 may be formed by stacking three or more resin layers. FIG. 7B shows the case where the resin layer 160 is formed of three layers; i.e., first, second, and third resin layers 161, 162, 163 respectively. In this case, the third resin layer 163 (i.e., the outermost layer) has an inclined surface 163s around an opening 163a.

In the wiring substrate 100 according to the above-described embodiment, the inclined surface 162s around the second opening 162a formed in the second resin layer 162 has a cross section defined by straight lines. However, no particular limitation is imposed on the shape of the inclined surface 162s, and the inclined surface 162s may have a curved cross section, so long as a portion of the second resin layer 162 on the side toward the second opening 162a approaches the layered structure.

DESCRIPTION OF REFERENCE NUMERALS

100: wiring substrate according to embodiment
110: core substrate
120, 140: insulating layer
120h, 140h: via hole
130, 150: conductor layer
160: resin layer
160a: opening
160s: front surface
161: first resin layer
161a: first opening
161s: front surface
162: second resin layer
162a: second opening
162s: inclined surface
200: comparative wiring substrate
D1 to D3: diameter
G1, G2: gap
L1, L2: wiring
M1: core wiring
S1: side surface
S2: front surface
T: connection terminal
V1, V2: via conductor

What is claimed is:

1. A wiring substrate comprising:
   a layered structure including one or more insulating layers and one or more conductor layers;
   a plurality of connection terminals formed on the layered structure;
   a first resin layer formed on the layered structure defining a plurality of first openings aligned with the connection terminals, such that the connection terminals are respectively exposed through the first openings; and
   a second resin layer formed on the first resin layer defining a plurality of second openings smaller in opening diameter than the first openings and aligned with the plurality of first openings, such that the plurality of connection terminals are respectively exposed through the plurality of second openings,
   wherein the second resin layer has, around each of the plurality of second openings, an inclined surface which is formed such that a distance between the inclined surface and the layered structure decreases toward each of the plurality of second openings.

2. The wiring substrate according to claim 1, wherein the plurality of connection terminals have a thickness smaller than a thickness of the first resin layer.

3. The wiring substrate according to claim 1, wherein the second resin layer has a thickness smaller than a thickness of the first resin layer.

4. The wiring substrate according to claim 1, wherein the plurality of connection terminals have side surfaces which are respectively exposed through the plurality of first openings.

5. A method for producing a wiring substrate, the method comprising the steps of:
   forming a layered structure by stacking one or more insulating layers and one or more conductor layers;
   forming a plurality of connection terminals on the layered structure;
   forming, on the layered structure, a first resin layer defining a plurality of first openings aligned with the connection terminals, such that the plurality of connection terminals are respectively exposed through the plurality of first openings; and
   forming, on the first resin layer, a second resin layer defining a plurality of second openings smaller in opening diameter than the first openings and aligned with the plurality of first openings, such that the plurality of connection terminals are respectively exposed through the plurality of second openings, the steps being carried out in this order.

6. The method for producing a wiring substrate according to claim 5, wherein the plurality of connection terminals have a thickness smaller than a thickness of the first resin layer.

7. The method for producing a wiring substrate according to claim 5, wherein the second resin layer has a thickness smaller than a thickness of the first resin layer.

8. The method for producing a wiring substrate according to claim 5, wherein the first resin layer is formed on the layered structure so that side surfaces of the plurality of connection terminals are respectively exposed through the first openings.

* * * * *